United States Patent
Pilipili Matadi (10) Patent No.: US 12,352,819 B2
(45) Date of Patent: Jul. 8, 2025

(54) METHOD FOR DETERMINING THE STATE OF HEALTH OF A LITHIUM-ION BATTERY

(71) Applicant: SOCOMEC, Benfeld (FR)

(72) Inventor: Bramy Pilipili Matadi, Chambery (FR)

(73) Assignee: SOCOMEC, Benfeld (FR)

( * ) Notice: Subject to any disclaimer, the term of this patent is extended or adjusted under 35 U.S.C. 154(b) by 390 days.

(21) Appl. No.: 17/754,402

(22) PCT Filed: Sep. 30, 2020

(86) PCT No.: PCT/EP2020/077381
§ 371 (c)(1),
(2) Date: Mar. 31, 2022

(87) PCT Pub. No.: WO2021/064030
PCT Pub. Date: Apr. 8, 2021

(65) Prior Publication Data
US 2022/0342003 A1    Oct. 27, 2022

(30) Foreign Application Priority Data

Oct. 1, 2019 (FR) ........................ 1910857

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3835* (2019.01);
(Continued)

(58) Field of Classification Search
CPC ............ G01R 31/392; G01R 31/367; G01R 31/3835; G01R 31/3648; H01M 10/0525;
(Continued)

(56) References Cited

U.S. PATENT DOCUMENTS

| | | | |
|---|---|---|---|
| 2015/0066406 A1* | 3/2015 | Sun | G01R 31/392 702/63 |
| 2015/0200425 A1 | 7/2015 | Iriyama et al. | |
| 2021/0359347 A1* | 11/2021 | Stefanopoulou | H01M 10/0525 |

FOREIGN PATENT DOCUMENTS

| | | |
|---|---|---|
| EP | 3 080 625 A1 | 10/2016 |
| WO | 2015/086753 A1 | 6/2015 |

OTHER PUBLICATIONS

Anseán et al. ("Lithium-Ion Battery Degradation Indicators Via Incremental Capacity Analysis," in IEEE Transactions on Industry Applications, vol. 55, No. 3, pp. 2992-3002, May-Jun. 2019, doi: 10.1109/TIA.2019.2891213.) (Year: 2019).*

(Continued)

*Primary Examiner* — Lisa M Caputo
*Assistant Examiner* — Christian T Bryant
(74) *Attorney, Agent, or Firm* — Studebaker Brackett PLLC (57) ABSTRACT

A method for determining the state of health (SOH) of a lithium-ion battery includes: a first step (E1) of determining a function (f) of the incremental capacity of the battery, a second step (E2) of identifying peaks (P1, P2, P3) of the function (f) determined in the first step (E1), a third step (E3) of determining voltages (U1, U2, U3) across the terminals of the battery (1) for which said peaks (P1, P2, P3) are obtained, a fourth step (E4) of determining the amplitudes of said peaks (P1, P2, P3), a sixth step (E6) of determining the state of health (SOH) of the battery (1) on the basis of a degradation mode of the battery and on the basis of the amplitudes determined in the fourth step (E4).

17 Claims, 4 Drawing Sheets

(51) Int. Cl.

| | |
|---|---|
| *G01R 31/3835* | (2019.01) |
| *H01M 4/505* | (2010.01) |
| *H01M 4/525* | (2010.01) |
| *H01M 4/583* | (2010.01) |
| *H01M 10/0525* | (2010.01) |
| *H01M 10/44* | (2006.01) |
| *H01M 10/48* | (2006.01) |
| *H02J 7/00* | (2006.01) |
| *G01R 31/36* | (2020.01) |
| *H01M 4/02* | (2006.01) |
| *H01M 4/58* | (2010.01) |

(52) U.S. Cl.
CPC ....... *H01M 10/0525* (2013.01); *H01M 10/44* (2013.01); *H01M 10/48* (2013.01); *H02J 7/005* (2020.01); *H02J 7/007* (2013.01); *G01R 31/3648* (2013.01); *H01M 2004/027* (2013.01); *H01M 2004/028* (2013.01); *H01M 4/505* (2013.01); *H01M 4/525* (2013.01); *H01M 4/5825* (2013.01); *H01M 4/583* (2013.01); *Y02E 60/10* (2013.01)

(58) Field of Classification Search
CPC ...... H01M 10/44; H01M 10/48; H01M 4/505; H01M 4/525; H01M 4/5825; H01M 4/583; H01M 2004/027; H01M 2004/028; H02J 7/005; H02J 7/007; Y02E 60/10
See application file for complete search history.

(56) References Cited

OTHER PUBLICATIONS

Dubarry et al.(Synthesize battery degradation modes via a diagnostic and prognostic model, Journal of Power Sources, vol. 219, 2012, pp. 204-216, ISSN 0378-7753, https://doi.org/10.1016/j.jpowsour.2012.07.016.) (Year: 2012).*

Riviere et al. ("LiFePO4 Battery State of Health Online Estimation Using Electric Vehicle Embedded Incremental Capacity Analysis," 2015 IEEE Vehicle Power and Propulsion Conference (VPPC), Montreal, QC, Canada, 2015, pp. 1-6, doi: 10.1109/VPPC.2015.7352972.) (Year: 2015).*

Vatani et al. ("State of Health Prediction of Li-ion Batteries using Incremental Capacity Analysis and Support Vector Regression," 2019 IEEE Milan PowerTech, Milan, Italy, 2019, pp. 1-6, doi: 10.1109/PTC.2019.8810665.) (Year: 2019).*

Pastor-Fernández et al. (A Comparison between Electrochemical Impedance Spectroscopy and Incremental Capacity-Differential Voltage as Li-ion Diagnostic Techniques to Identify and Quantify the Effects of Degradation Modes within Battery Management Systems, Journal of Power Sources, vol. 360, 2017,) (Year: 2017).*

Birkl et al. (Degradation diagnostics for lithium ion cells, Journal of Power Sources, vol. 341, 2017, pp. 373-386, ISSN 0378-7753, https://doi.org/10.1016/j.jpowsour.2016.12.011.) (Year: 2016).*

Pastor-Fernández et al.("A SoH diagnosis and prognosis method to identify and quantify degradation modes in Li-ion batteries using the IC/DV technique," 6th Hybrid and Electric Vehicles Conference (HEVC 2016), London, UK, 2016, pp. 1-6, doi: 10.1049/cp.2016.0966.) (Year: 2016).*

International Search Report issued in PCT/EP2020/077381; mailed Dec. 8, 2020.

* cited by examiner

METHOD FOR DETERMINING THE STATE OF HEALTH OF A LITHIUM-ION BATTERY

CROSS-REFERENCE TO RELATED APPLICATIONS

This application is the U.S. National Stage of International Application No. PCT/EP2020/077381 filed Sep. 30, 2020, which claims benefit of priority to French Patent Application No. 1910857 filed Oct. 1, 2019, the entire contents of which prior applications are incorporated herein by reference.

TECHNICAL FIELD OF THE INVENTION

The invention relates to a method for determining the state of health of a lithium-ion battery. The invention also pertains to a method for determining a formula for calculating the state of health of a lithium-ion battery. The invention also pertains to a diagnostic device comprising hardware and software means that are able to implement such a method for determining the state of health of a lithium-ion battery.

PRIOR ART

Lithium-ion batteries are used in many technical fields, such as for example mobile telephony or the automotive industry. These batteries have a limited service life. The service life of a battery may vary depending on its usage conditions, in particular depending on its usage frequency and/or depending on the charging and discharging currents that are applied and/or depending on its usage temperatures. The ageing of a battery is characterized in particular by a loss of capacity of the battery in comparison with its new state.

The state of health of a battery, also called SOH, is defined by the ratio of the current capacity of a battery to its nominal capacity, that is to say its capacity in the new state. Over the life of a battery, the state of health of a battery gradually degrades from a value of 100% to a point where it is no longer able to be used in the given application.

To determine the state of health of a battery, one commonly used method consists in fully recharging a battery and then in fully discharging it to a zero state of charge. By counting the charge discharged by the battery (that is to say by integrating the discharging current over the entire discharge period), it is possible to calculate the current capacity of the battery. However, this method exhibits drawbacks. In particular, it requires a full charge followed by a full discharge of the battery. However, during normal use thereof, a battery is rarely fully charged and then discharged before being recharged again. A specific cycle is therefore necessary to calculate the state of health of the battery.

Moreover, it is also useful to ascertain a potential degradation mode in line with which a battery degrades. Indeed, depending on the degradation mode of a battery, a greater or lesser loss of power may occur, in addition to the loss of capacity of the battery. In order to ascertain the degradation mode of a battery, a physico-chemical appraisal of the battery is generally performed. The battery is opened, and then the anode and the cathode are inspected to determine the ageing mechanism of the battery. Among these ageing mechanisms, it is possible to identify in particular:

deposition of metallic lithium (dendrites)
loss of electrical contact
particle cracking
exfoliation of the negative electrode (made of graphite)
dissolution of transition metals
growth of SEI ("Solid Electrolyte Interphase" or passivation film)
decomposition of the SEI

PRESENTATION OF THE INVENTION

The aim of the invention is to provide a method for determining the state of health of a lithium-ion battery that overcomes the above drawbacks and improves the determination methods known from the prior art.

More specifically, a first subject of the invention is a method for determining the state of health of a lithium-ion battery that does not require a full charge/discharge cycle of the battery.

A second subject of the invention is a method for determining the state of health of a lithium-ion battery that also makes it possible to determine a degradation mode of the battery without damaging it.

SUMMARY OF THE INVENTION

The invention relates to a method for determining the state of health of a lithium-ion battery, the method comprising:
a first step of determining a function that defines a relationship between an incremental capacity of the battery and a voltage across the terminals of the battery,
a second step of identifying peaks of the function determined in the first step,
a third step of determining voltages across the terminals of the battery for which said peaks are obtained,
a fourth step of determining the amplitudes of said peaks,
a fifth step of determining a degradation mode of the battery on the basis of the voltages determined in the third step, and on the basis of the amplitudes determined in the fourth step,
a sixth step of determining the state of health of the battery on the basis of the degradation mode determined in the fifth step and on the basis of the amplitudes determined in the fourth step.

The incremental capacity of a battery may be defined by a ratio of a differential of the amount of charge of the battery to a differential of the voltage across the terminals of the battery.

The amplitude of one of said peaks determined in the fourth step may be equal to an integral of the incremental capacity over a voltage range defined around one of the voltages determined in the third step, said voltage range in particular being less than or equal to 50 mV and/or greater than or equal to 20 mV.

The second step may comprise identifying a first peak obtained with a first voltage across the terminals of the battery, a second peak obtained with a second voltage across the terminals of the battery, and a third peak obtained with a third voltage across the terminals of the battery, the first voltage being strictly greater than the second voltage and strictly less than the third voltage.

The first step may be performed by charging the battery with a charging rate less than or equal to C/5, in particular less than or equal to C/10, in particular less than or equal to C/25.

The battery may comprise a negative electrode based on graphite or based on lithium titanate, and/or the battery may comprise a positive electrode based on one of the following materials:

lithium iron phosphate
lithium nickel manganese cobalt oxide
lithium cobalt oxide
lithium nickel cobalt aluminum oxide
a mixture of lithium cobalt oxide and lithium nickel cobalt aluminum oxide.

The sixth step may comprise a sub-step of selecting a formula for calculating the state of health of the battery on the basis of the degradation mode determined in the fifth step, and then a sub-step of calculating the state of health of the battery using the selected formula and using an amplitude determined in the fourth step.

Said formula may be a linear function dependent on an amplitude determined in the fourth step.

The invention also relates to a method for determining a formula for calculating the state of health of a battery of a lithium-ion battery, the formula being able to be used in a determination method as defined above, the method comprising:
 a battery ageing step of ageing a lithium-ion battery,
 a step of measuring a state of health of the battery through coulometric analysis,
 a step of determining a function that defines a relationship between an incremental capacity of the battery and a voltage across the terminals of the battery,
 a step of identifying peaks on the function determined in the previous step,
 a step of determining voltages across the terminals of the battery for which said peaks are obtained,
 a step of determining amplitudes of said peaks,
 a step of determining a degradation mode of the battery through a physical appraisal of the battery.

The invention also relates to a diagnostic device comprising hardware and software means that are able to implement the determination method as defined above.

The invention also relates to a computer program product able to be downloaded from a communication network and/or recorded on a computer-readable and/or computer-executable data medium, comprising instructions that, when the program is executed by the computer, prompt said computer to implement the method as defined above.

The invention also relates to a computer-readable recording medium comprising instructions that, when they are executed by a computer, prompt said computer to implement the method as defined above.

The invention also relates to a signal from a data medium, carrying the computer program product as defined above.

PRESENTATION OF THE FIGURES

These aims, features and advantages of the present invention will be explained in detail in the following description of one particular embodiment, given on a non-limiting basis with reference to the appended figures, in which.

DETAILED DESCRIPTION

Figure 1:
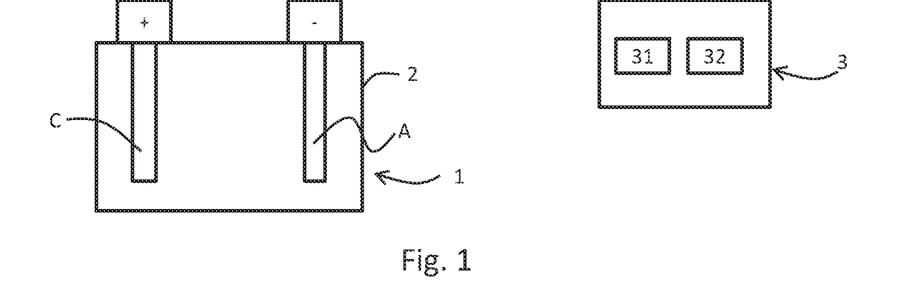
FIG. 1 is a schematic view of a lithium-ion battery connected to a diagnostic device according to one embodiment of the invention.

FIG. 1 schematically illustrates a lithium-ion battery 1. The battery 1 may comprise a set of cells 2, also called "accumulators" or "rechargeable batteries", connected together so as to form an electrical voltage generator. Each cell 2 comprises a positive electrode, or cathode C, and a negative electrode, or anode A. The cathodes C of the various cells are connected directly or indirectly to a positive terminal of the battery.

Likewise, the anodes A of the various cells are connected directly or indirectly to a negative terminal of the battery.

A lithium-ion battery is a battery in which lithium ions may be exchanged reversibly between the positive electrode and the negative electrode. The negative electrode may be based on graphite (LixC6) or based on lithium titanate (LTO). The negative electrode therefore comprises an active material that may be formed of graphite (LixC6) or formed of lithium (LTO). The positive electrode may be based on one of the following materials:
 lithium iron phosphate (LFP),
 lithium nickel manganese cobalt oxide (NMC),
 lithium cobalt oxide (LCO),
 lithium nickel cobalt aluminum oxide (NCA),
 a mixture of lithium cobalt oxide and lithium nickel cobalt aluminum oxide (LCO-NCA blend).

The battery 1 is connected, via its positive terminal and via its negative terminal, to a diagnostic device 3 according to one embodiment of the invention. The diagnostic device 3 comprises a memory 31 and a microprocessor 32. The memory 31 is a computer-readable recording medium comprising instructions that, when they are executed by the microprocessor 32, prompt said microprocessor to implement a method for determining the state of health of the battery according to one embodiment of the invention. Advantageously, the diagnostic device 3 is also a battery charger. It is therefore used not only to recharge the battery 1 when it is discharged, but also to determine its state of health.

A description is now given of a method for determining the state of health of the battery 1 according to one embodiment of the invention. The determination method may be broken down into six steps E1, E2, E3, E4, E5, E6, shown schematically in FIG. 2. These six steps may be performed successively, that is to say that step E1 is executed, and then step E2, and then step E3, and then step E4, and then step E5 and finally step E6. The method may be repeated as often as necessary in order to update the state of health value.

The state of health of a cell 2, commonly called SOH, may be defined as the ratio of the current capacity of the cell to its nominal capacity, that is to say its capacity in the new state. As a side note, it is also possible to define the state of health of a battery comprising multiple cells as a function of the state of health of the cells forming it. The method according to the invention may very well also be implemented in order to directly determine the state of health of a battery comprising multiple cells or to determine the state of health of an individual cell. The following explanations, although they relate to a cell, may thus be transposed to the scale of a battery.

Figure 2:
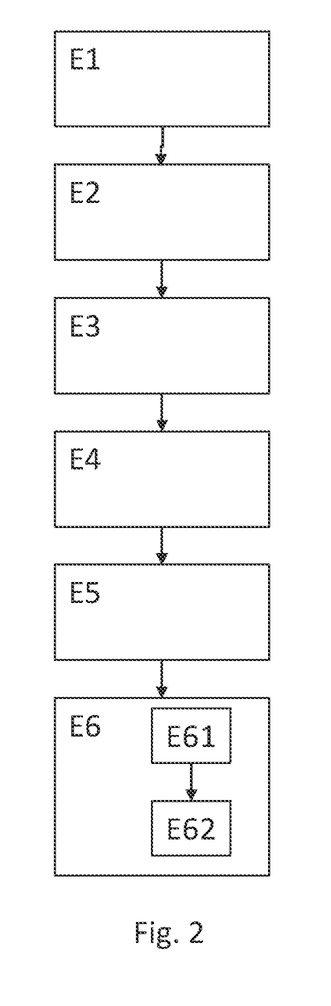
FIG. 2 is a block diagram showing the steps of a method for determining the state of health of a battery according to one embodiment of the invention.

In a first step E1, a function f that defines a relationship between an incremental capacity of the cell and a voltage across the terminals of the cell is determined.

The incremental capacity of the cell may be defined as the ratio of a differential of the amount of charge dQ of the cell to a differential of the voltage dU across the terminals of the battery. In other words, the incremental capacity may be defined as the derivative of an amount of charge of the cell with respect to a voltage across the terminals of the cell. In other words, the function f is the function that satisfies the following equation:

$$dQ/dU=f(U) \qquad \text{[Math 1]}$$

wherein U denotes the voltage across the terminals of the cell and Q denotes the amount of charge of the cell. The function f may be stored in the memory 31, for example in the form of a correspondence table between values of the voltage across the terminals of the cell, on the one hand, and incremental capacity values, on the other hand. As a variant, the incremental capacity of the cell could also be defined by the ratio of a voltage differential to a charge amount differential (dU/dQ). The following explanations would then be adapted accordingly.

Figure 3:
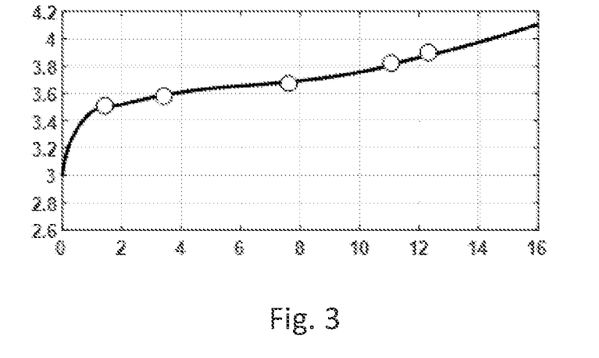
FIG. 3 is a graph showing the evolution of the voltage across the terminals of a lithium-ion cell as a function of its charge, the voltage being expressed in volts and the charge being expressed in ampere-hours.

FIG. 3 illustrates a charge curve of the cell 2. In this case, the cell 2 is an NMC cell. Such a curve may be established during a full charge of the cell by storing the voltage across the terminals of the cell and the charging current. The voltage across the terminals of the cell is expressed in volts and is shown on the ordinate. The charge of the battery is expressed in ampere-hours (Ah) and is shown on the abscissa. The voltage across the terminals of the cell is an increasing function of its charge. According to the embodiment shown here, that is to say for the case of an NMC cell, the voltage across the terminals of the battery is between 2.7 V (when the battery is fully discharged) and around 4.2 V (when the battery is fully charged). The capacity of the battery here is around 16 Ah. This curve is therefore obtained by fully charging the cell. Of course, the invention may be adapted to any other type of cell, in particular a cell having a different nominal voltage, and/or a different capacity, and/or a different internal chemical composition.

Figure 4:
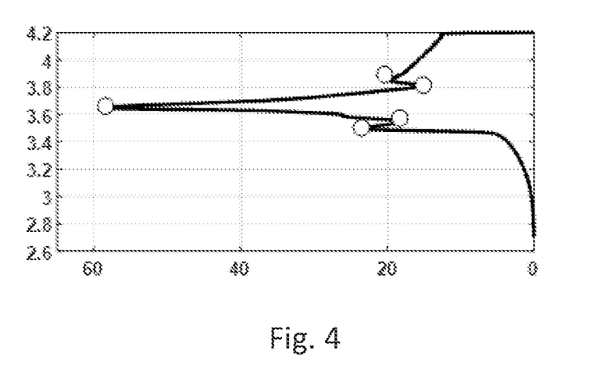
FIG. 4 is a graph showing the evolution of the voltage across the terminals of a cell of a lithium-ion battery as a function of an incremental capacity of the cell.

FIG. 4 shows the voltage U (expressed in volts) across the terminals of the cell as a function of the incremental capacity dQ/dU of the cell. The curve of FIG. 4 may be obtained by performing an operation of differentiating the charge curve illustrated in FIG. 2.

Figure 5:
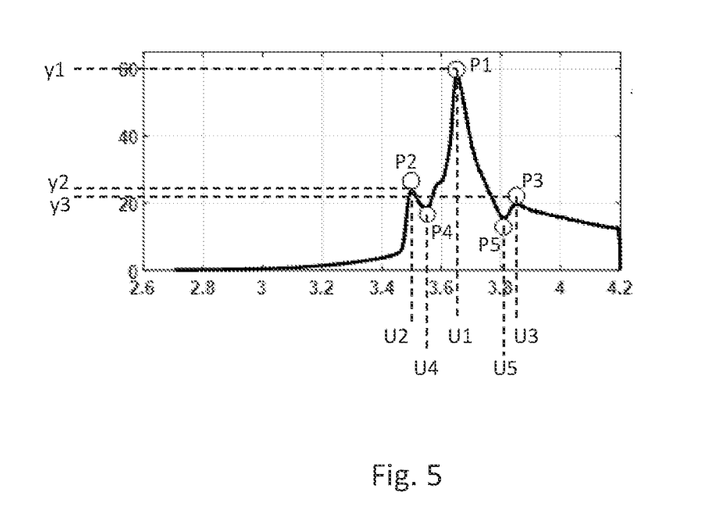
FIG. 5 is a first graph showing the evolution of the incremental capacity of a cell of a lithium-ion battery as a function of the voltage across the terminals of the cell.

FIG. 5 shows the incremental capacity dQ/dU of the cell as a function of the voltage U (expressed in volts) across the terminals of the cell. The curve of FIG. 5 may be obtained by swapping the abscissa axis and the ordinate axis of FIG. 4. The curve illustrated in FIG. 5, which may also be called incremental capacity curve, has a particular trend, specific to the cell 2. The incremental capacity curve therefore forms a signature of the cell 2. The trend of this curve depends on the chemical nature of the cell, but also on its state of health.

According to one variant embodiment of step E1, the function f that defines the relationship between the incremental capacity of the cell and the voltage across the terminals of the cell could be established not during charging of the cell, but during discharging thereof.

In a second step E2, peaks on the function determined in the first step are identified. Indeed, as may be seen in FIG. 4, and even more distinctly in FIG. 5, the lithium-ion battery cell incremental capacity curves generally comprise five peaks P1, P2, P3, P4 and P5. In particular, they notably comprise three upward peaks P1, P2, P3, otherwise called "high points", and two downward peaks P4, P5, otherwise called "low points". With reference to FIG. 4, the peak P4 is positioned between the peak P1 and the peak P2 along the abscissa axis, and the peak P5 is positioned between the peak P1 and the peak P3 along the abscissa axis. According to the embodiment of the method that is described, the three peaks P1, P2 and P3 are identified in particular in this first step. The peaks P4 and P5 are not used in the continuation of the method. However, according to one variant embodiment of the invention, the method could be adapted to use other peaks of the function f: for example only one peak or only two peaks from among the three peaks P1, P2 and P3. The method could also be adapted to use the identification of the peaks P4 and P5 in addition to or instead of using the peaks P1, P2 and P3.

As a side note, the slower the battery charging rate in the first step, the easier the peaks are able to be identified. A charging rate equal to C/5 or slower makes it possible to obtain good identification of the peaks and therefore reliable determination of a degradation mode of the cell and reliable determination of the state of health of the cell. The charging rate may thus be less than or equal to C/5, in particular less than or equal to C/10, or even less than or equal to C/25. It is specified that C denotes the charging rate necessary to fully charge the cell in one hour. A charging rate of C/N therefore denotes a rate that makes it possible to fully recharge the battery in N hours.

To implement the method according to the invention, it is not necessary to fully charge the cell, since it is enough to cover only the three peaks P1, P2 and P3. With reference to FIG. 3, it is noted that charging the cell so as to increase the voltage across its terminals from around 3.4 volts to around 3.9 volts is sufficient. With reference to FIG. 1, it is observed that a charge of around 12 ampere-hours is sufficient to implement the method, while the capacity of the cell is 16 ampere-hours. A charge corresponding to around 75% of the total capacity of the cell may therefore be sufficient to determine its state of health. As will be seen later on, the amount of charge needed to determine the state of health of the cell may be further reduced from this value of 75% by covering only two peaks, or even a single peak from among the three peaks P1, P2 and P3.

The peak P1 corresponds to the maximum value of the function f. It is reached for a first voltage U1 across the terminals of the cell. According to the example illustrated in FIGS. 5 and 6, this first voltage is between 3.6 and 3.8 volts. The peak P2 corresponds to a local maximum of the function f. It is reached for a second voltage U2 across the terminals of the cell. According to the example illustrated in FIGS. 5 and 6, this second voltage U2 is between 3.4 and 3.6 volts. The peak P3 also corresponds to a local maximum of the function f. It is reached for a third voltage U3 across the terminals of the cell. According to the example illustrated in FIGS. 5 and 6, this third voltage U3 is between 3.8 and 4.0 volts. The first voltage U1 is strictly greater than the second voltage U2 and strictly less than the third voltage U3. The peak P4 corresponds to a local minimum of the function f. It is reached for a fourth voltage U4 across the terminals of the cell. According to the example illustrated in FIGS. 5 and 6, this fourth voltage U4 is between 3.4 and 3.6 volts. The fourth voltage U4 is strictly greater than the second voltage U2 and strictly less than the first voltage U1. The peak P5 also corresponds to a local minimum of the function f. It is reached for a fifth voltage U5 across the terminals of the cell. According to the example illustrated in FIGS. 5 and 6, this fifth voltage U5 is close to 3.8 volts. The fifth voltage U5 is strictly greater than the first voltage U1 and strictly less than the third voltage U3.

As a side note, the function f could comprise more peaks, in particular in the event that the acquisition of the points of this function were to be noisy or disturbed by an external cause. Mathematical algorithms, such as noise reduction algorithms, may be used to identify the peaks P1, P2, and P3 and clearly distinguish them from other local maxima linked to noise or to a disturbance of the function f.

As will be seen later on, the abscissa (the voltage U across the terminals of the cell) and the ordinate (the incremental capacity) of the three peaks P1, P2 and P3 are used to determine a degradation mode of the cell, and then to determine the state of health of the battery.

The peaks P1 to P3 are points with a zero derivative of the function f defined by $dq/du=f(u)$. In other words, they are local extremes of the function f. The peaks may for example be identified by calculating the derivative function f' of the function f and then by determining the voltage values across the terminals of the cell satisfying the equality $f'(U)=0$. As a variant, other mathematical methods may be applied to identify the peaks.

In a third step E3, three voltages U1, U2, U3 across the terminals of the cell for which the peaks P1, P2, P3 are respectively obtained are determined. The three voltages U1, U2 and U3 correspond to the abscissa of the peaks P1, P2 and P3 on the graph shown in FIGS. 5 and 6.

In a fourth step E4, the amplitudes of the peaks P1, P2 and P3 are determined. The amplitude of a peak may be calculated in various ways. According to a first approach, the amplitude of one of said peaks may simply be equal to the value of the incremental capacity at the peak under consideration. With reference to the graphs shown in FIGS. 4 and 5, the amplitude may then simply be read on the ordinate of the graph. In other words, the amplitude of the peaks P1, P2, P3 may be respectively equal to f(U1), f(U2), f(U3). These values are denoted respectively y1, y2 and y3 in FIG. 5.

Figure 6:
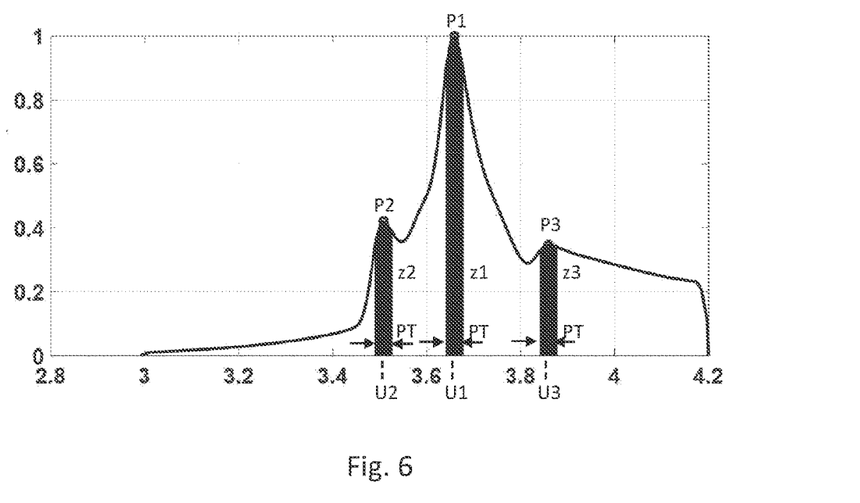
FIG. 6 is a second graph showing the evolution of the incremental capacity of a cell of a lithium-ion battery as a function of the voltage across the terminals of the cell, the ordinate axis being normalized.

According to a second approach, illustrated in FIG. 6, the amplitude of one of said peaks may be calculated with an integral of the incremental capacity over a voltage range PT defined around one of the voltages determined in the third step, that is to say the voltages U1, U2, U3. The voltage range PT is advantageously centered on the voltage under consideration. The result of this integral calculation may therefore be equal to the area under the incremental capacity curve, respectively identified by z1, z2 and z3. This calculation method may be easier to implement than the method for determining the ordinate of the peaks explained above. Moreover, this method makes it possible to obtain a result that is less sensitive to possible aberrant singular values.

The extent of the voltage range PT under consideration is advantageously less than or equal to 50 mV and/or greater than or equal to 20 mV. Indeed, it has been observed that, when the extent of the voltage range is between these two values, this results in particularly reliable determination of a degradation mode of the cell and of the state of health of the cell.

At the end of the fourth step, there are therefore voltages U1, U2 and U3 and amplitudes of the peaks P1, P2 and P3 calculated using at least one of the two methods described above.

In a fifth step E5, a degradation mode of the cell is determined on the basis of a comparison of the voltages U1, U2, U3 determined in the third step with first reference values, and on the basis of a comparison of the amplitudes determined in the fourth step with second reference values. The degradation mode of the cell may be identified from among a set of degradation modes that have been characterized beforehand. In this case, the degradation mode is determined from among four possible degradation modes. These four degradation modes cover the majority of the known ageing mechanisms of a cell or a battery.

FIGS. 7, 8, 9 and 10 illustrate the evolution of the function f characterizing the cell when said cell experiences a particular degradation mode. Each of these four figures show multiple curves corresponding to multiple states of health of the cells. In particular, each of the figures show four curves corresponding respectively to a state of health equal to 100%, 95%, 90%, 85%. Macroscopically, it is observed that, regardless of the degradation mode under consideration, the more the state of health of a cell decreases, the more its incremental capacity decreases. However, examining the evolution of each of the curves more closely reveals differences in the way in which the curves evolve according to the degradation mode under consideration. Each degradation mode has a corresponding incremental capacity peak displacement scenario, and therefore a mathematical law of evolution of the state of health associated either with the height of the peaks or with the regional capacity around them, which decreases as ageing increases.

Figure 7:
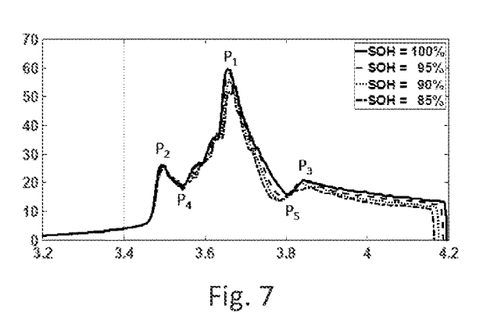
FIG. 7 is a graph showing the evolution of the incremental capacity of a cell of a lithium-ion battery as a function of the voltage across the terminals of the cell for various states of health of the cell, the cell experiencing degradation through loss of active material on a positive electrode.

FIG. 7 shows the evolution of the incremental capacity of the cell when the cell experiences degradation through loss of active material on the positive electrode. This degradation mode may occur in particular in the event of dissolution of transition metals within the cell. When the state of health of the cell decreases, it is observed that the amplitude of the first peak P1 decreases, but that the voltage U1 associated with the first peak remains substantially stable. The amplitude of the second peak P2 and the voltage U2 associated with the second peak remain unchanged overall. The amplitude of the third peak P3 and the voltage U3 associated with the third peak both decrease (the third peak P3 moves downward and to the left in the graph of FIG. 7).

Figure 8:
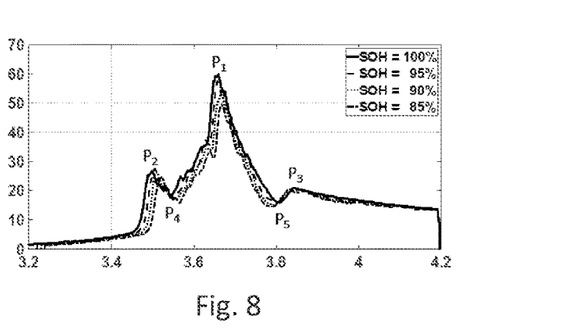
FIG. 8 is a graph showing the evolution of the incremental capacity of a cell of a lithium-ion battery as a function of the voltage across the terminals of the cell for various states of health of the cell, the cell experiencing degradation through loss of active material on a negative electrode.

FIG. 8 shows the evolution of the incremental capacity of the cell when the cell experiences degradation through loss of active material on the negative electrode. This degradation mode may occur in particular with one of the following degradation mechanisms:

deposition of metallic lithium (dendrites)
loss of electrical contact
particle cracking
exfoliation of the negative electrode (made of graphite).

When the state of health of the cell decreases, it is observed that the amplitude of the first peak P1 decreases and that the voltage U1 associated with the first peak increases (the first peak P1 moves downward and to the right on the graph of FIG. 8). The amplitude of the second peak P2 and the voltage U2 associated with the second peak both decrease. The amplitude of the third peak P3 remains substantially stable, but the voltage U3 associated with the third peak decreases.

Figure 9:
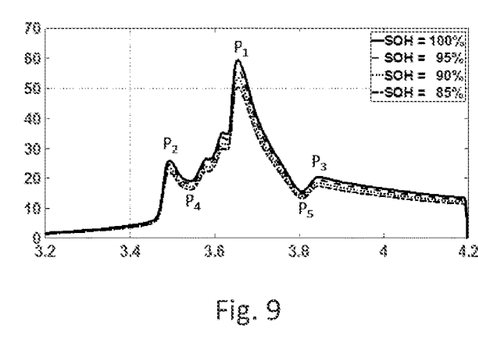
FIG. 9 is a graph showing the evolution of the incremental capacity of a cell of a lithium-ion battery as a function of the voltage across the terminals of the cell for various states of health of the cell, the cell experiencing degradation through loss of active material on both electrodes.

FIG. 9 shows the evolution of the incremental capacity of the cell when the cell experiences degradation through loss of active material on both electrodes. When the state of health of the cell decreases, it is observed that the amplitude of the first peak P1 decreases and that the voltage U1 associated with the first peak remains stable. Likewise, the amplitude of the second peak P2 decreases and the voltage U2 associated with the second peak remains stable. Likewise, the amplitude of the third peak P3 decreases but the voltage U3 associated with remains stable.

Figure 10:
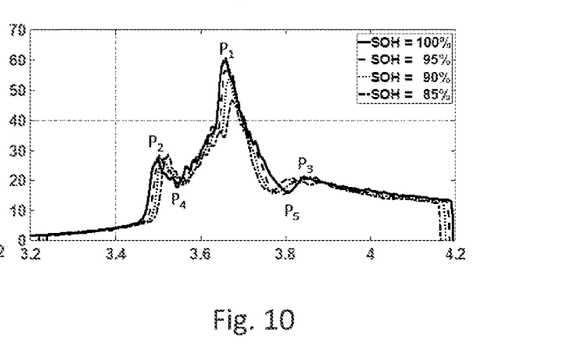
FIG. 10 is a graph showing the evolution of the incremental capacity of a cell of a lithium-ion battery as a function of the voltage across the terminals of the cell for various states of health of the cell, the cell experiencing degradation through loss of cyclable lithium.

FIG. 10 shows the evolution of the incremental capacity of the cell when the cell experiences degradation through loss of cyclable lithium. This degradation mode may occur in particular in the event of growth or dissolution of the SEI (acronym for "Solid Electrolyte Interphase" or passivation film between negative electrode and electrolyte). When the state of health of the cell decreases, it is observed that the amplitude of the first peak P1 decreases and that the voltage U1 associated with the first peak increases. The amplitude of the second peak P2 remains stable overall, but the voltage U2 associated with the second peak increases. The amplitude of the third peak P3 remains stable, but the voltage U3 associated with the third peak P3 decreases.

Based on the above observations, it is possible to determine the degradation mode of a cell from among the following four degradation modes:
  the loss of active material on the positive electrode,
  the loss of active material on the negative electrode,
  the loss of active material on both electrodes,
  the loss of cyclable lithium.

In order to determine the degradation mode, it is possible for example to compare the voltage U1 corresponding to the peak P1 with a first reference value V1. If the voltage U1 is greater than or equal to the reference value V1, it is possible to compare the amplitude of the second peak P2 with a second reference value V2. If the amplitude of the second peak P2 is greater than or equal to the second reference value V2, it may be deduced therefrom that the cell is degrading through loss of cyclable lithium. If the amplitude of the second peak P2 is strictly less than the second reference value V2, it may be deduced therefrom that the cell is degrading through loss of active material on the negative electrode. On the other hand, if the voltage U1 is strictly less than the first reference value V1, it is possible to compare the amplitude of the second peak P2 with a third reference value V3. If the amplitude of the second peak P2 is greater than or equal to the third reference value V3, it may be deduced therefrom that the cell is degrading through loss of active material on the positive electrode. On the other hand, if the amplitude of the second peak P2 is strictly less than the third reference value V3, it may be deduced therefrom that the cell is degrading through loss of active material on both electrodes.

This logical reasoning is given by way of non-limiting example. More complex algorithms using the amplitude of each of the three peaks P1, P2 and P3 and the three voltages U1, U2 and U3 may be implemented in order to more reliably determine the degradation mode of the cell. In particular, using the two peaks P1 and P2 and the corresponding voltages U1 and U2 may be sufficient to determine the degradation mode of the cell with good reliability. In general, the determination of the degradation mode may be based on the comparison of the voltages U1, and/or U2, and/or U3 with first reference values and/or on the comparison of the amplitudes of the peaks P1, and/or P2, and/or P3 (calculated with the first or the second method explained above) with second reference values.

At the end of the fifth step, a degradation mode of the cell has therefore been determined. This determination does not require an appraisal of the electrodes, but only analysis of the incremental capacity of the cell. It is therefore a non-destructive method for determining the degradation mode of a cell.

In a sixth step E6, the state of health SOH of the cell is determined on the basis of the degradation mode determined in the fifth step and on the basis of the amplitudes determined in the fourth step.

The sixth step E6 may comprise a first sub-step E61 of selecting a formula for calculating the state of health of the cell on the basis of the degradation mode determined in the fifth step. Next, the sixth step may comprise a second sub-step E62 of calculating the state of health SOH of the cell using the selected formula and using an amplitude determined in the fourth step.

The formula may be for example a linear function g, that is to say a function of the following type:

$$g(x)=a\cdot x+b \qquad \text{[Math 2]}$$

a and b being predefined constants,
  x being a variable intended to be replaced by an amplitude value of a peak P1, P2, P3 determined in the fourth step.

As a variant, the formula could be more complex. It could for example be a polynomial function of any order. It could also use the amplitude of two distinct peaks, for example the peak P1 and the peak P2, or the peak P1 and the peak P3, or even the peak P2 and the peak P3. The formula could also use the amplitude of the three peaks P1, P2 and P3.

The method for determining the state of health of the cell has the advantage of requiring only a partial charge of the cell, since it is enough for the charge of the cell to make it possible to identify the three peaks P1, P2 and P3. Adapting the determination method makes it possible to further reduce the charge amplitude necessary to provide an estimate of the state of health. The method could thus be adapted so as to determine the state of health of the cell based on the use of only two peaks (for example the peaks P1 and P2 or the peaks P1 and P3), or even just one of the three peaks P1, P2, P3. In this case, the charge necessary to implement the invention could be reduced further and could then be less than or equal to 50%, or even less than or equal to 25% of the total capacity of the battery. According to one variant embodiment, the formula g could be selected not only on the basis of the identified degradation mode, but also on the basis of the peaks P1, P2 and P3 detected during charging. Thus, for example, in the case of a partial charge revealing only one of the peaks P1, P2 or P3, an appropriate formula could be used.

Table 1 below illustrates, by way of example, the calculation formulas used to determine the state of health SOH of cells with various types of positive electrode (lithium iron phosphate (LFP), lithium nickel manganese cobalt oxide (NMC), a mixture of lithium cobalt oxide and lithium nickel cobalt aluminum oxide (LCO blend)). The third column contains formulas whose variable y is equal to the peak amplitude calculated using the first method explained above (by reading the ordinate of the peak P1, P2 or P3). The fourth column contains formulas whose variable z is equal to the peak amplitude calculated using the second method explained above (by calculating an integral of the incremental capacity over a voltage range PT around the peak P1, P2 or P3, the voltage range under consideration, specifically 20 mV, 30 mV or 50 mV, being indicated between parentheses). The peak under consideration (P1, P2 or P3) is indicated in front of the formula. Some formulas may be based on the amplitude of the first peak P1. Other formulas may be based on the amplitude of the third peak P3. Some formulas may comprise second-order polynomial functions.

E14 are the same as those that will be applied in the first step E1 of the method for determining the state of health of a cell. The temperature may for example be set at 25° C. and the charging rate may for example be set at C/25.

Steps E12, E13 and E14 may then be repeated multiple times in order to define the relationship between the incremental capacity of the cell and the voltage across the terminals of the cell for various state of health values. A number N of functions f1, f2, . . . fN is thus obtained, for the same number of states of health of the battery. As a side note, the greater the number N, the more precise the formula for calculating the state of health that will be determined may

TABLE 1

| Identified degradation mode | Nature of the positive electrode of the cell | Y = Ordinate of the peak | Z = Regional capacity of the peak | |
|---|---|---|---|---|
| Loss of cyclable lithium | NMC or LCO blend | $P_1$: SOH = 0.5602y + 0.4398 | $P_1$ (50 mV): SOH = 0.6152z + 0.3783 | |
| | | | $P_1$ (30 mV): SOH = 0.6026z + 0.3946 | |
| | | | $P_1$ (20 mV): SOH = 0.5130z + 0.4866 | |
| | LFP | P3: SOH = 0.2550y + 0.7042 | $P_3$ (30 mV): SOH = 0.5090z + 0.4925 | |
| | | | $P_3$ (20 mV): SOH = 0.3909z + 0.5906 | |
| Loss of active material on the negative electrode | NMC LCO blend | $P_1$: SOH = 0.5409y + 0.4561 $P_1$: SOH = $-0.4958y^2$ + 1.0677y + 0.4264 | $P_1$ (50 mV): SOH = 0.6063z + 0.3885 $P_1$ (30 mV): SOH = 0.5643z + 0.4384 $P_1$ (20 mV): SOH = 0.5426z + 0.4630 | |
| | LFP | P3: SOH = 0.2462y + 0.7367 | $P_3$ (50 mV): SOH = 0.6439z + 0.3406 | |
| | | | $P_3$ (30 mV): SOH = 0.3133z + 0.6849 | |
| | | | $P_3$ (20 mV): SOH = 0.3401z + 0.6597 | |
| Loss of active material on both electrodes | MMC LCO blend | $P_1$: SOH = 0.6419y + 0.3562 $P_1$: SOH = $-0.7626y^2$ + 1.6415y + 0.1189 | $P_1$ (50 mV): SOH = 0.7211z + 0.2712 $P_1$ (20 mV): SOH = 0.7181z + 0.2894 $P_1$ (30 mV): SOH = 0.6812z + 0.3317 | |

Figure 11:
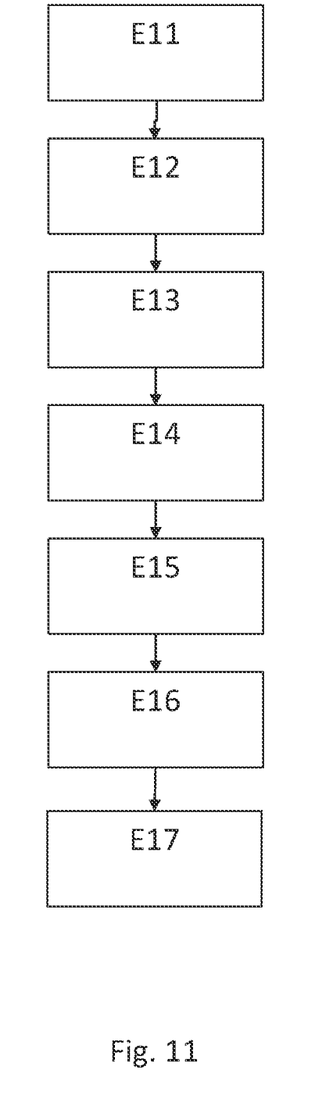
FIG. 11 is a block diagram showing the steps of a method for determining a formula for calculating the state of health of a lithium-ion battery.

FIG. 11 now illustrates a method for determining a formula g for calculating the state of health of a cell 2 according to one embodiment of the invention. Once this formula g has been determined, it may be stored in the memory 31 of the diagnostic device 3 with a view to implementing the method for determining the state of health of a cell as described above. First of all, in a first step E11, it is possible to determine the function f0 that defines the relationship between the incremental capacity of the cell and the voltage across the terminals of the cell, when the cell is in the new state, that is to say with a state of health of 100%.

Next, in a second step E12, the cell may be subjected to ageing. This ageing may be achieved by repeating battery charging and discharging cycles under particular conditions. For example, the temperature and/or the humidity surrounding the cell, the electrical charging and discharging currents of the cell may be adapted in order to cause a particular degradation mode.

Once the cell 2 has aged, it is possible, in a third step E13, to measure the state of health of the cell. A method known from the prior art may then be used, in particular coulometric analysis. Coulometric analysis is understood to mean that the capacity of the battery is calculated by integrating the electrical discharging current over the entire discharge period, the cell then being discharged from 100% to 0%.

In a fourth step E14, a function f1 that defines the relationship between the incremental capacity of the cell and the voltage across the terminals of the cell is again determined. In this step E14, the cell therefore has a state of health strictly less than 100%. This step may be performed in parallel with the third step or even in a dedicated phase of charging the cell. Advantageously, the temperature and charging rate conditions that are applied in the fourth step be. However, it is also possible to make do with a single characterization for a single state of health other than 100%. In this case, the number of tests required is limited.

In a fifth step E15, it is possible to identify the peaks P1, P2, P3 on each of the previously determined functions f0 to fN. For each of the functions, the voltages U1, U2, U3 for which the peaks are reached are identified, along with the amplitudes of these peaks, using the first method, using the second method or even using both methods described above.

Next, in a sixth step E16, it is possible to determine the function g that defines the relationship between the state of health of the cell and one or more amplitudes of the peaks P1, P2 and P3. A method such as the least-squares method could be used. The state of health may then be calculated using the following formula $$SOH = g(y) \quad \text{[Math 3]}$$

y denoting the amplitude of one or more peaks of the function f.

Finally, in a seventh step E17, a physico-chemical appraisal of the cell is performed in order to confirm the degradation mode that it has experienced. A physico-chemical appraisal of the cell consists in disassembling it and inspecting each of the electrodes. It is then possible to perform visual analysis or chemical analysis of the electrodes in order to determine the degradation mode of the cell. Advantageously, various ageing conditions of the cell, in the second step E12, make it possible to cover all possible degradation modes of the cell.

The determination method that has just been described therefore makes it possible to determine a formula that makes it possible to easily calculate the state of health of a cell on the basis of the amplitude of peaks identified on its incremental capacity characteristic. This formula is specific to a particular cell design, that is to say to a positive electrode type and to a negative electrode type. This method is preferably repeated in order to determine formulas for calculating the state of health of cells having a different design.

The invention claimed is:

1. A method for determining a state of health of a lithium-ion battery, comprising:
    a first step of determining a function that defines a relationship between an incremental capacity of the battery and a voltage across the terminals of the battery, wherein the first step is performed by charging or discharging the battery,
    a second step of identifying peaks of the function determined in the first step,
    a third step of determining voltages across the terminals of the battery for which said peaks are obtained,
    a fourth step of determining the amplitudes of said peaks,
    a fifth step of determining a degradation mode of the battery on the basis of the voltages determined in the third step, and on the basis of the amplitudes determined in the fourth step,
    a sixth step of determining the state of health of the battery on the basis of the degradation mode determined in the fifth step and on the basis of the amplitudes determined in the fourth step,
        wherein the sixth step comprises a sub-step of selecting a formula for calculating the state of health of the battery on the basis of the degradation mode determined in the fifth step, and then a sub-step of calculating the state of health of the battery using the selected formula and using an amplitude determined in the fourth step.

2. The determination method as claimed in claim 1, wherein the incremental capacity of a battery is defined by a ratio of a differential of the amount of charge of the battery to a differential of the voltage across the terminals of the battery.

3. The determination method as claimed in claim 2, wherein the amplitude of one of said peaks determined in the fourth step is equal to an integral of the incremental capacity over a voltage range defined around one of the voltages determined in the third step, said voltage range in particular being less than or equal to 50 mV and/or greater than or equal to 20 mV.

4. The determination method as claimed in claim 2, wherein the second step comprises identifying a first peak obtained with a first voltage across the terminals of the battery, a second peak obtained with a second voltage across the terminals of the battery, and a third peak obtained with a third voltage across the terminals of the battery, the first voltage being strictly greater than the second voltage and strictly less than the third voltage.

5. The determination method as claimed in claim 1, wherein the amplitude of one of said peaks determined in the fourth step is equal to an integral of the incremental capacity over a voltage range defined around one of the voltages determined in the third step, said voltage range in particular being less than or equal to 50 mV and/or greater than or equal to 20 mV.

6. The determination method as claimed in claim 5, wherein the second step comprises identifying a first peak obtained with a first voltage across the terminals of the battery, a second peak obtained with a second voltage across the terminals of the battery, and a third peak obtained with a third voltage across the terminals of the battery, the first voltage being strictly greater than the second voltage and strictly less than the third voltage.

7. The determination method as claimed in claim 1, wherein the second step comprises identifying a first peak obtained with a first voltage across the terminals of the battery, a second peak obtained with a second voltage across the terminals of the battery, and a third peak obtained with a third voltage across the terminals of the battery, the first voltage being strictly greater than the second voltage and strictly less than the third voltage.

8. The determination method as claimed in claim 1, wherein the first step is performed by charging the battery with a charging rate less than or equal to C/5.

9. The determination method as claimed in claim 8, wherein the first step is performed by charging the battery with a charging rate less than or equal to C/10.

10. The determination method as claimed in claim 9, wherein the first step is performed by charging the battery with a charging rate less than or equal to C/25.

11. The determination method as claimed in claim 1, wherein the battery comprises a negative electrode based on graphite or based on lithium titanate, and/or in that the battery comprises a positive electrode based on one of the following materials:
    lithium iron phosphate,
    lithium nickel manganese cobalt oxide,
    lithium cobalt oxide,
    lithium nickel cobalt aluminum oxide,
    a mixture of lithium cobalt oxide and lithium nickel cobalt aluminum oxide.

12. The determination method as claimed in claim 1, wherein said formula is a linear function dependent on an amplitude determined in the fourth step.

13. A method for determining a formula for calculating a state of health of a lithium-ion battery, the formula being able to be used in a determination method as claimed in claim 1, the method comprising:
    a battery ageing step of ageing a lithium-ion battery,
    a step of measuring a capacity of the battery through coulometric analysis,
    a step of determining a function that defines a relationship between an incremental capacity of the battery and a voltage across the terminals of the battery,
    a step of identifying peaks on the function determined in the previous step,
    a step of determining voltages across the terminals of the battery for which said peaks are obtained,
    a step of determining amplitudes of said peaks,
    a step of determining a degradation mode of the battery through a physical appraisal of the battery, and
    a step of determining the formula based on the determined degradation mode.

14. A diagnostic device, comprising hardware and software means that are able to implement the determination method as claimed in claim 1.

15. A computer program product able to be downloaded from a communication network and/or recorded on a computer-readable and/or computer-executable data medium, characterized in that it comprises instructions that, when the program is executed by the computer, prompt said computer to implement the method as claimed in claim 1.

16. A signal from a data carrier, carrying the computer program product as claimed in claim 15.

17. A computer-readable recording medium comprising instructions that, when they are executed by a computer, prompt said computer to implement the method as claimed in claim 1.

* * * * *